United States Patent
Shrinivasan et al.

(10) Patent No.: US 6,563,092 B1
(45) Date of Patent: May 13, 2003

(54) MEASUREMENT OF SUBSTRATE TEMPERATURE IN A PROCESS CHAMBER USING NON-CONTACT FILTERED INFRARED PYROMETRY

(75) Inventors: Krishnan Shrinivasan, San Jose, CA (US); Arkadiy Shimanovich, San Francisco, CA (US); Prasad N. Gadgil, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/997,870

(22) Filed: Nov. 28, 2001

(51) Int. Cl.$^7$ .................................................. H05B 1/02
(52) U.S. Cl. ................. 219/502; 219/497; 219/121.43; 118/725; 156/345; 392/416
(58) Field of Search ................................ 219/497, 502, 219/121.43, 499, 501; 392/416–418; 118/724, 725; 156/345

(56) References Cited

U.S. PATENT DOCUMENTS

| | | | |
|---|---|---|---|
| 4,550,684 A | 11/1985 | Mahawili | 118/724 |
| 4,680,447 A | 7/1987 | Mahawili | 219/343 |
| 4,890,245 A | 12/1989 | Yomoto et al. | 364/557 |
| 4,890,933 A | 1/1990 | Amith et al. | 374/121 |
| 4,979,134 A | 12/1990 | Arima et al. | 364/557 |
| 5,098,199 A | 3/1992 | Amith | 374/121 |
| 5,102,231 A | 4/1992 | Loewenstein et al. | 374/129 |
| 5,167,452 A | 12/1992 | Amith et al. | 374/121 |
| 5,170,041 A | 12/1992 | Amith et al. | 219/497 |
| 5,249,142 A | 9/1993 | Shirakawa et al. | 364/557 |
| 5,258,602 A | 11/1993 | Naselli et al. | 219/497 |
| 5,305,416 A | 4/1994 | Fiory | 392/416 |
| 5,305,417 A * | 4/1994 | Najm et al. | 392/418 |
| 5,308,161 A | 5/1994 | Stein | 374/5 |
| 5,317,656 A | 5/1994 | Moslehi et al. | 385/12 |
| 5,442,727 A | 8/1995 | Fiory | 392/416 |
| 5,474,381 A | 12/1995 | Moslehi | 374/161 |
| 5,508,934 A | 4/1996 | Moslehi et al. | 364/468 |
| 5,624,590 A | 4/1997 | Fiory | 219/390 |
| 5,741,070 A | 4/1998 | Moslehi | 374/161 |
| 5,823,681 A | 10/1998 | Cabib et al. | 374/126 |
| 5,944,422 A | 8/1999 | Diotel et al. | 374/131 |
| 6,284,051 B1 * | 9/2001 | Fidelman | 118/724 |

* cited by examiner

*Primary Examiner*—Mark Paschall
(74) *Attorney, Agent, or Firm*—Michael L. Gencarella

(57) ABSTRACT

Methods and an apparatus for providing a non-contact probe for accurately measuring the temperature of a substrate in a process chamber are disclosed. One exemplary apparatus is a processing chamber, which includes a heating source, where the heating source heats the substrate. Also included is a window maintained at a substantially constant temperature. The window allows only a first wavelength spectrum of energy emitted from the heating source to pass. In addition, the window isolates the heating source from an internal region of the processing chamber. A probe configured to detect a second wavelength spectrum of energy emitted directly from the substrate is included. The energy emitted directly from the substrate corresponds to a temperature of the substrate, and the temperature of the substrate is provided to the controller, which adjusts an intensity of the heating source based on a set point temperature for the substrate.

28 Claims, 6 Drawing Sheets

MEASUREMENT OF SUBSTRATE TEMPERATURE IN A PROCESS CHAMBER USING NON-CONTACT FILTERED INFRARED PYROMETRY

BACKGROUND OF THE INVENTION

1. Field of the Invention

This invention relates generally to methods and apparatus for measurement and control of temperature and more particularly for measurement and control of a substrate temperature within a semiconductor process chamber.

2. Description of the Related Art

Photoresist layers are typically applied and patterned over surfaces of a substrate prior to the formation of features during the manufacture of semiconductor devices. Upon completion of these processes the patterned photoresist must be removed through photoresist stripping or ashing. Quite often a photoresist asher removes a photoresist layer by reacting free radical oxygen atoms with the resist material at an elevated temperature. In addition, the photoresist asher often incorporates a microwave or radio frequency (RF) plasma generator to produce free radical oxygen atoms and oxygen ions, which in turn strip the photoresist through high temperature oxidation. The temperature of the substrate directly impacts the rate of removal of the resist during the process. Photoresist stripping is employed primarily after implant operations where selected areas of a substrate are implanted or "doped" by elements such as boron and phosphorous to define the transistors in an integrated circuit. In another application, patterned photoresist defines regions of dielectric or metal layers that must be removed to form the interconnect wiring that constitute an integrated circuit (IC).

The introduction of new materials and the shrinking of feature sizes in integrated circuits are requiring the development of new photoresist formulations and processes. Tight temperature control of the substrate in an ashing chamber is critical as devices on the substrate can become damaged if the temperature overshoots a set point temperature. On the other hand, the process may not run efficiently if the temperature is not high enough. For example, photoresist stripping rate has been measured to increase by approximately 300 Å per minute for each 1° C. change in substrate temperature. One skilled in the art would appreciate that an inaccurate temperature measurement and control can have disastrous consequences for overall device yield. In ashing chambers where the substrate is being heated by lamps, closed loop temperature control is applied to accurately maintain a temperature set point. In a closed loop temperature control system, the temperature of an object, such as the substrate, is measured and the feedback from the temperature measurement is used by a power control system that controls the intensity of a heating source to increase or decrease the temperature.

FIG. 1A displays a block diagram 100 representing a prior art closed loop controller for the temperature of a substrate in an ashing chamber. In diagram 100, a sensor 104 measures the temperature of a substrate 102. A signal corresponding to the temperature measured by the sensor is sent to the controller, which in turn controls the intensity of heat lamps 108 according to the difference in values of the temperature of the substrate and a set point temperature.

The sensor 104 of diagram 100 is a critical component of the control loop since it needs to provide accurate temperature measurement and must be capable of withstanding the harsh environment of the ashing chamber. FIG. 1B illustrates a detailed view of one prior art sensor employed to measure substrate temperature, where lamps are used to heat the substrate. This sensor consists of a thermocouple bead 111 contacting the substrate through an aluminum pad 103 where the aluminum pad 103 and thermocouple is attached to a pin supporting the substrate 102. FIG. 1B illustrates a diagram of the contact between the substrate 102 and a thermocouple sensor pad 103. Since the backside surface of the substrate and the aluminum pad surface are not completely smooth, a gas gap 110 exists at the interface of the two surfaces. The gas gap 110 exists even though substrate support extension 101 provides a gimballing effect to support pad 103 against the backside surface of the substrate since the corresponding surfaces are not completely smooth. The gas gap 110 causes inaccuracies in temperature measurement especially under the operating condition for ashing processes as is explained further below. The probe body 105 encases thermocouple wires 109a and 109b, which are routed through a high vacuum seal since the chambers typically operate under low pressures below 2 torr.

As mentioned above, the ashing process is performed at a low process pressure, typically below 2 Torr. Therefore, very little gas exists in the gas gap 110 to conduct the heat from the substrate to the contact pad. As a result of the gas being evacuated from the gas gap 110, the effective thermal conductivity is low, which in turn makes it difficult to accurately measure the temperature of the substrate. This method of temperature measurement requires detailed calibration of each individual sensor. Such calibration is normally performed using instrumented substrates. Consequently, the accuracy of such calibration is dependent on the reproducibility of the quality of the substrate-pad contact. Additionally, the characteristics of thermal interaction between substrate and pad vary with both pressure and substrate temperature. This necessitates detailed calibration over an extensive range of temperatures and operating pressures. Furthermore, the contact between the substrate and the aluminum pad is different for each substrate, thus injecting additional variables into the temperature measurement process, not to mention the poor calibration resulting from the substrate-to-substrate inconsistencies. The aluminum pad also oxidizes over time, thereby changing the characteristics of the pad for each process, which in turn further throws off the calibration.

Another type of sensor used in ashing chambers is an optical emissivity sensor. Processing chambers, where the substrate is supported by an RF-excited platen to generate the plasma, cannot use thermocouples since the wires of the thermocouple act as antennas. Because the high voltages induced in the thermocouple lead wires can damage sensitive electronic circuitry to which the thermocouple wires are connected, unshielded thermocouples are typically not used in the presence of RF-excited platens. Therefore, an optical emissivity sensor may be used to measure the temperature of the substrate to avoid this antenna effect. FIG. 1C illustrates block diagram 112 representing a prior art processing chamber employing an optical emissivity probe 124 to measure the temperature of the substrate 102. The chamber 126 includes a microwave source 114 and a radio frequency (RF) source 118. When the chamber 126 is operating in the microwave mode, i.e. microwave source activated and RF source deactivated, pins 128 lift the substrate 102 off of the platen 120. In the RF mode the substrate 102 rests on the platen 120. Here, the sensor assembly, including the contact pad 122, is used as one support in conjunction with the pin 128 when the substrate is elevated for microwave processing. Typically, microwave processing is performed at elevated temperatures as high as 300° C. for which lamps 108 are employed.

The optical sensor 124 of FIG. 1C measures temperature of the substrate 102 by detecting the emitted infrared radiation from the backside of the pad 122 which is in contact with the substrate 102. Similar problems as encountered with thermocouples persist with the optical sensor 124. The pad 122 for the optical sensor also oxidizes over time. Accordingly, the emissivity of the backside of the pad changes with time. In addition, the optical sensor 124 must be contained in a light-proof housing 123. Since the lamps 108 emit high intensity radiation, any light leak through the housing 123 of the optical sensor 124, could trigger the optical sensor to measure temperature of the lamps 108, which is much higher than that of the substrate. Furthermore, the optical sensor 124 must be thermally isolated from the chamber body to prevent inaccurate measurement of substrate temperature due to local cooling of the substrate, since the sensor is being heated at one end and cooled at the other end.

For this reason, pyrometers that directly measure substrate temperature are used in most Rapid Thermal Processing (RTP) chambers where substrate temperature is typically above 600° C.. At 600° C. a semiconductor substrate is opaque to the incident radiation from the lamps, and hence blocks incident radiation of the lamps from the pyrometer. However, at temperatures below 600° C., the substrate is not opaque to the incident radiation from the heating lamps. Therefore, radiation from the lamps will be incident on the pyrometer through the substantially transparent substrate. The pyrometer will thus be reading the lamps' filament temperature rather than the substrate temperature. In essence, the transmittance ($\tau$), which is defined as the fraction of radiant energy that is transmitted through the substrate, is approximately 0 at temperatures greater than 600° C. As the temperature of the substrate decreases below 300° C., the transmittance of the substrate substantially increases. Below 300° C., which is a typical temperature range for ashing and photoresist stripping processes, the substrate transmittance increases to 0.8 for the range of wavelengths emitted by a heat source, such as a halogen lamp used in an ashing chamber. Accordingly, pyrometers designed for RTP processes are not useful at the temperatures encountered in an ashing chamber or in photoresist stripping processes.

In spite of these properties, previous practitioners of pyrometry for RTP processes have had to implement various sophisticated correction algorithms. Some practitioners have had to implement additional probes in an RTP chamber to compensate for the effect of background radiation on substrate temperature measurement. Others have had to provide a reference source of radiation, separate from that emitted by the heat source, to measure reflective and absorptive response of the substrate to this reference source, and to then infer substrate temperature from such response. In summary, current state-of-the-art does not provide for dynamic substrate temperature measurement with reasonable accuracy at temperatures normally used for photoresist stripping. Moreover, current methods in use for resist stripping chambers employ contact pads that require extensive and frequent calibration to minimize any drift due to pad degradation. Also, pyrometry that is typical in high temperature RTP processes is not feasible in photoresist stripping because of the high transmissivity and low emissivity characteristic of semiconductor substrates at resist stripping temperatures.

As a result, there is an urgent need to solve the problems of the prior art to provide a non-contact temperature measuring device capable of accurately operating at low temperatures that are typical in certain semiconductor processes such as photoresist stripping.

SUMMARY OF THE INVENTION

Broadly speaking, the present invention fills these needs by providing a method and apparatus for measuring the temperature of a body from a remote location. It should be appreciated that the present invention can be implemented in numerous ways, including as a process, an apparatus, a system, or a device. Several inventive embodiments of the present invention are described below.

In one embodiment, an apparatus for measuring and maintaining a substantially constant temperature of a substrate in a processing chamber is provided. The processing chamber includes a heating source controlled by a controller, where the heating source emits energy for heating the substrate. Also included is a window maintained at a substantially constant temperature. The window is configured to allow a first wavelength spectrum of energy emitted from the heating source to pass through the window. In addition, the window isolates the heating source from an internal region of the processing chamber. A probe is included. The probe is configured to detect a second wavelength spectrum of energy, distinct from the first wavelength spectrum of energy, emitted directly from the substrate. The energy emitted directly from the substrate in the second wavelength spectrum corresponds to a temperature of the substrate, and the temperature of the substrate is provided to the controller, which adjusts an intensity of the heating source based on a set point temperature for the substrate.

In another embodiment, a temperature controlling system for controlling the temperature of a substrate in a chamber is provided. The system includes a heating source and a window. The window is transparent to a first spectrum of wavelengths of energy from the heating source while being opaque to a second spectrum of wavelengths of energy from the heating source. A cooling system is included. The cooling system maintains the window at a substantially constant temperature as the window absorbs the second spectrum of wavelengths of energy from the heating source. A probe is also included. The probe is located remotely from the substrate and configured to detect the second spectrum of wavelengths of energy emitted from the substrate, where the energy emitted from the substrate correlates to a temperature of the substrate. The temperature of the substrate is communicated to a controller of the heating source and the controller of the heating source controls an intensity of the heating source based upon the temperature of the substrate.

In still another embodiment, a method for measuring and maintaining a temperature of a substrate in a processing chamber is provided. The method initiates with providing energy from a heating source. Then, a first wavelength spectrum of the energy from the heating source passes through a window entering an internal region of the processing chamber. The substrate is heated by this first wavelength spectrum of the energy from the heating source. Next, a second wavelength spectrum of energy is filtered prior to entering an internal region of the processing chamber. Then, the energy emitted by the substrate is detected by a non-contact probe. The energy emitted by the substrate has a second wavelength spectrum. Then, an intensity of the heating source is adjusted based upon the detected energy emitted by the substrate.

In yet another embodiment, a method for measuring a temperature of a body in a chamber is provided. The chamber is configured to introduce heat energy through a window. The window is transparent to a first wavelength spectrum of the heat energy and opaque to a second wavelength spectrum of the heat energy. The method initiates with providing a heat source where the heat source emits the heat energy through the window into the chamber. Then, a cooling system for maintaining the window at a substantially constant temperature is provided. Next, the body is heated with the first wavelength spectrum of the heat energy. Then, the temperature of the body is detected, where the detecting includes providing a probe remotely located from the body and the probe configured to detect an intensity of the body's emissions of the second wavelength spectrum. Also included in the detecting is translating the detected intensity to the temperature of the body.

The advantages of the present invention are numerous. Most notably, contact with the backside of the substrate is not required. In addition, the high intensity of broad-band radiation emanating from the lamps does not affect the probe. The probe is protected from the environment of the chamber and can be adjusted on-line for different substrate backside emissivities. Furthermore, by utilizing high wavelength emissions from the substrate, full advantage is taken of the fact that emissions at high wavelengths are comparatively stronger at the operating temperatures typical of photoresist ashing operations.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1A:
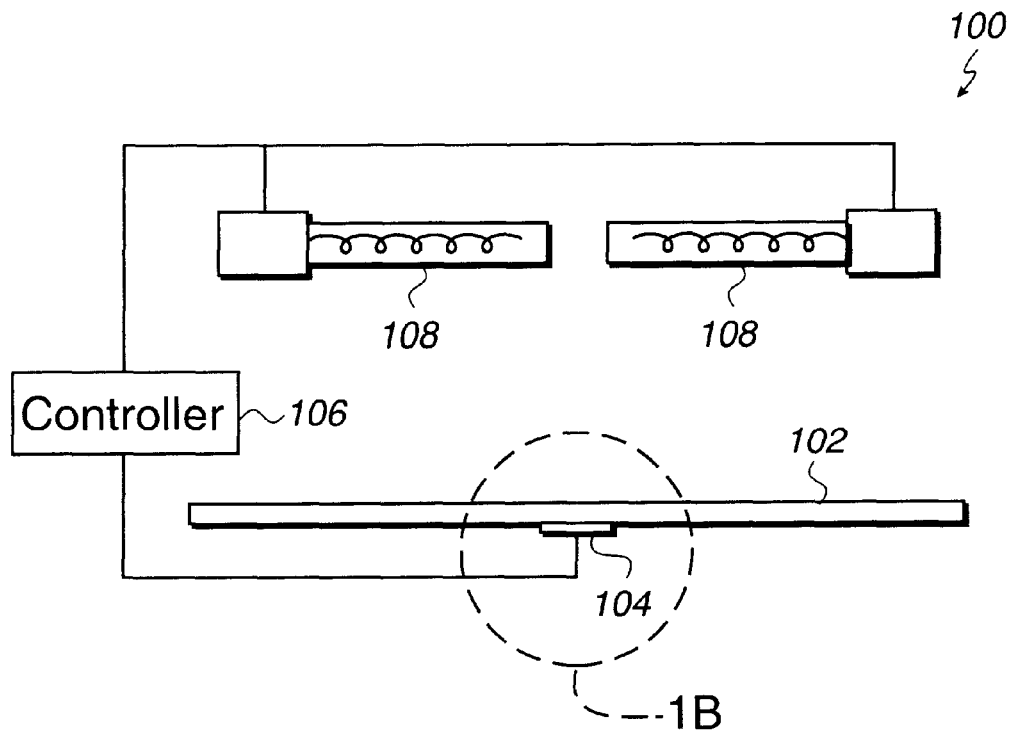
FIG. 1A displays a block diagram representing a prior art closed loop controller for the temperature of a substrate in an ashing chamber.
Figure 1B:
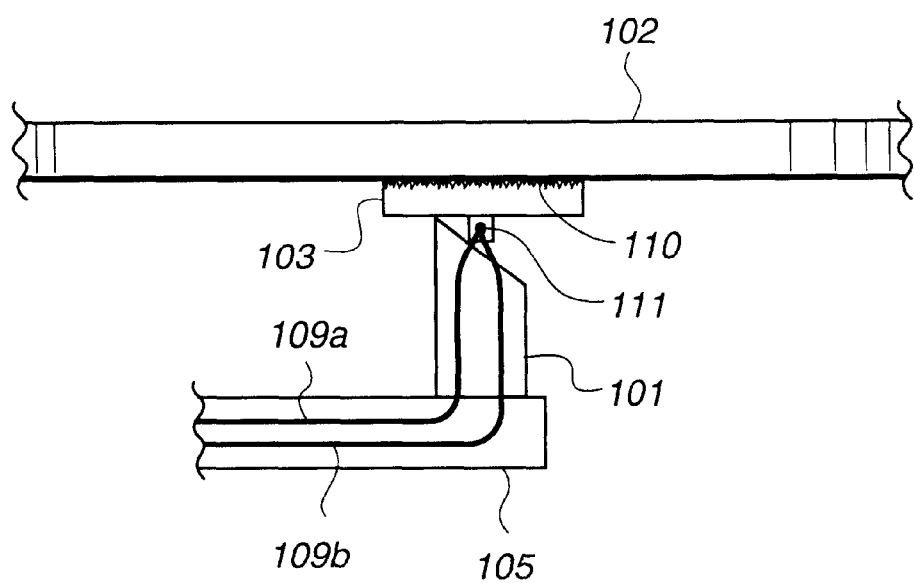
FIG. 1B illustrates a prior art diagram of the contact between the substrate and a thermocouple sensor pad.
Figure 1C:
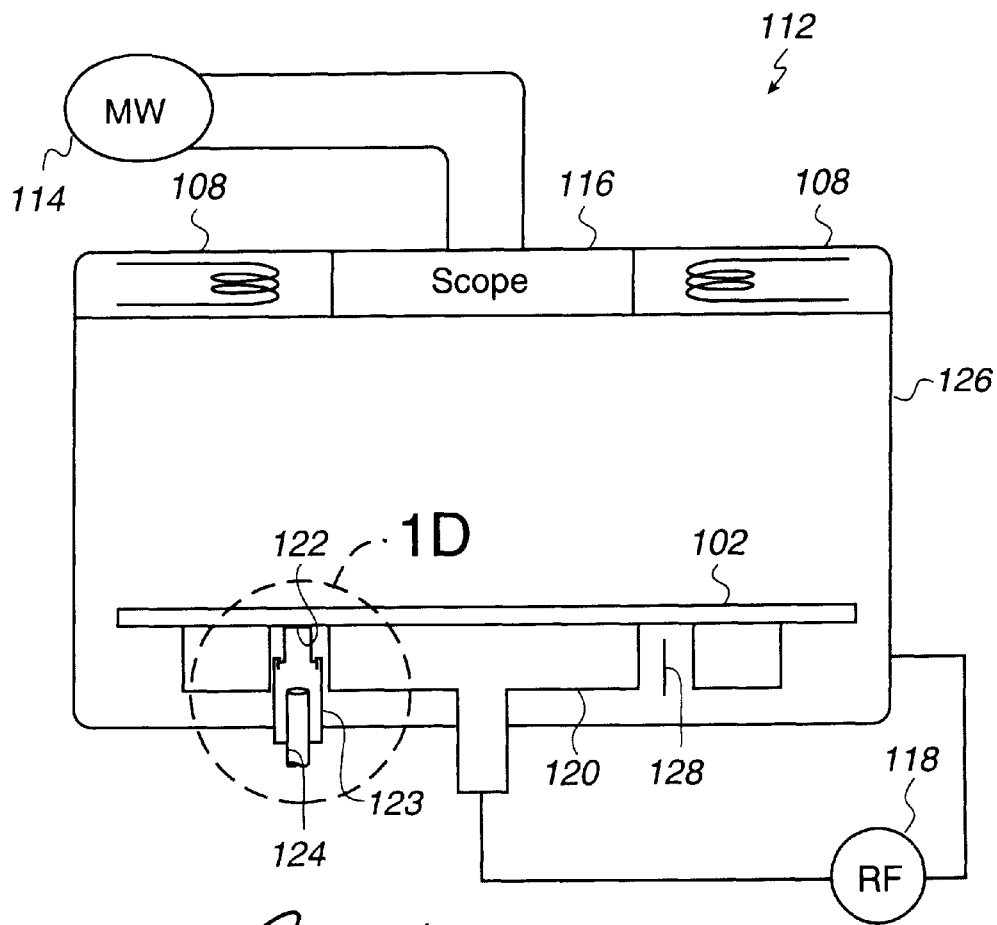
FIG. 1C illustrates a block diagram representing a prior art processing chamber employing an optical emissivity probe to measure the temperature of the substrate.
Figure 1D:
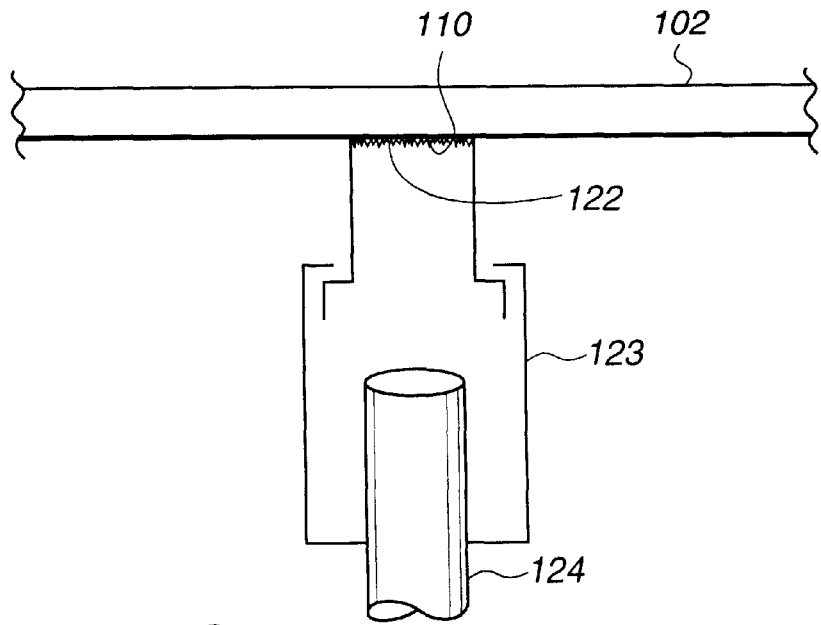
FIG. 1D illustrates a block diagram representing a more detailed view of a prior art optical sensor contact pad and an optical emissivity probe.

An invention is described for an apparatus and method for the non-contact measurement of the temperature of a substrate during semiconductor processing and simultaneously eliminating any radiation influence emitted by heating lamps. It will be obvious, however, to one skilled in the art, that the present invention may be practiced without some or all of these specific details. In other instances, well known process operations have not been described in detail in order not to unnecessarily obscure the present invention.

The embodiments of the present invention provide an apparatus and method for measuring the temperature of a substrate based upon the substrate's emissions in the infrared spectrum at wavelengths of greater than approximately 7 microns. The intensity of the radiation in this part of the spectrum is used to accurately calculate the temperature of the substrate without contacting the substrate. Since semiconductor substrates are substantially transparent to infrared radiation at temperatures encountered during photoresist strip processes, traditional pyrometers provide erroneous results because of the interference by direct radiation from an energy source, such as substrate-heating lamps.

By concentrating temperature measurement in the spectrum of radiation wavelengths of above 7 microns, the method and apparatus of the present invention take advantage of properties inherent in certain lamp window materials. In one embodiment, the lamp windows isolate the lamps from the internal process chamber where the semiconductor substrate sits. It should be appreciated that the isolation of the lamps eliminates the lamp surface as a potential source of contamination, while also providing a means for sealing the process vacuum inside the chamber against leakage of ambient air. Typically, the lamp windows are either quartz or sapphire. Quartz is opaque to the part of the infrared spectrum that is above about 5.5 microns while sapphire is opaque above about 7 microns. Accordingly, the lamp tray windows eliminate that portion of the lamp's emissive spectrum in which substrate emissions are being measured. Since the temperature measurement of the substrate is not affected by the radiation from the lamps, the temperature of the substrate surface is measured directly without interference from the lamps or having to compensate for the radiation from the lamps.

It should be appreciated that since quartz and sapphire windows absorb radiation above certain wavelengths, 5.5 and 7 microns respectively—these windows undergo heating themselves. As will be discussed below, the windows are cooled so that the windows remain at a substantially constant temperature in order to prevent interference from re-radiation of absorbed energy by the lamp tray windows in one embodiment. Keeping the temperature of the lamp tray windows substantially constant allows for compensation of re-radiation from the windows, while calibrating the substrate temperature measuring instrument itself. Additionally, the present invention measures the temperature of a substrate directly without the use of a prior art contact pad. Inaccuracies due to the non-repeatable nature of the substrate-pad contact and the low thermal conductivity between the substrate and contact pad are eliminated by the various embodiments of the present invention described below.

While the invention is described in terms of an ashing chamber for illustrative purposes, it should be appreciated that the invention can be used for any chamber utilizing infrared radiation to heat an object and control the temperature of the object through a closed loop temperature control system. As one skilled in the art would appreciate, under a closed loop temperature control system, the temperature of an object is measured and the feedback from the temperature measurement is fed in to a control system that controls the intensity of a heating source to increase or decrease the temperature of the object. As used herein, substrate can refer to any substrate including a semiconductor substrate also referred to as a wafer. The invention is described in more detail below in reference to the Figures.

Figure 2A:
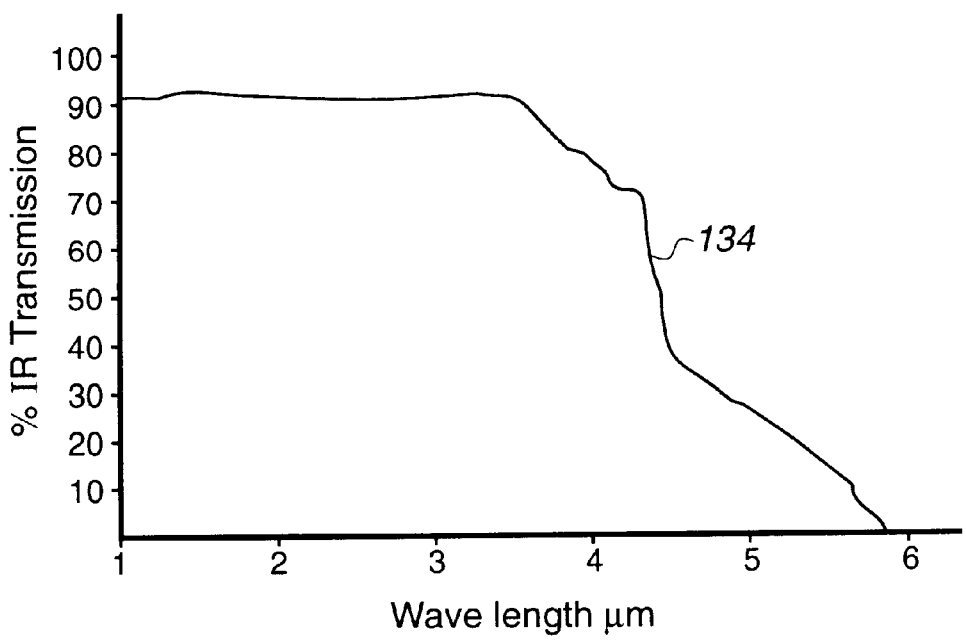
FIG. 2A illustrates a graphical representation of the transmittance of quartz over a range of wavelengths in accordance with one embodiment of the invention.

FIG. 2A illustrates a graphical representation of the transmittance of quartz over a range of wavelengths in accordance with one embodiment of the invention. The transmittance of quartz, represented by line 134, displays quartz's ability to absorb infrared radiation at wavelengths greater than about 5.5 microns, while approximately 90% of all incident light is transmitted at wavelengths below about 4 microns with decreasing amounts of incident light being transmitted between wavelengths of about 4 microns and about 5.5 microns. It should be appreciated that any radiation transmitted through the window at a wavelength above about 7 microns will interfere with the temperature measurement of the substrate as the probe will be measuring intensity of the radiation from the heating source.

Figure 2B:
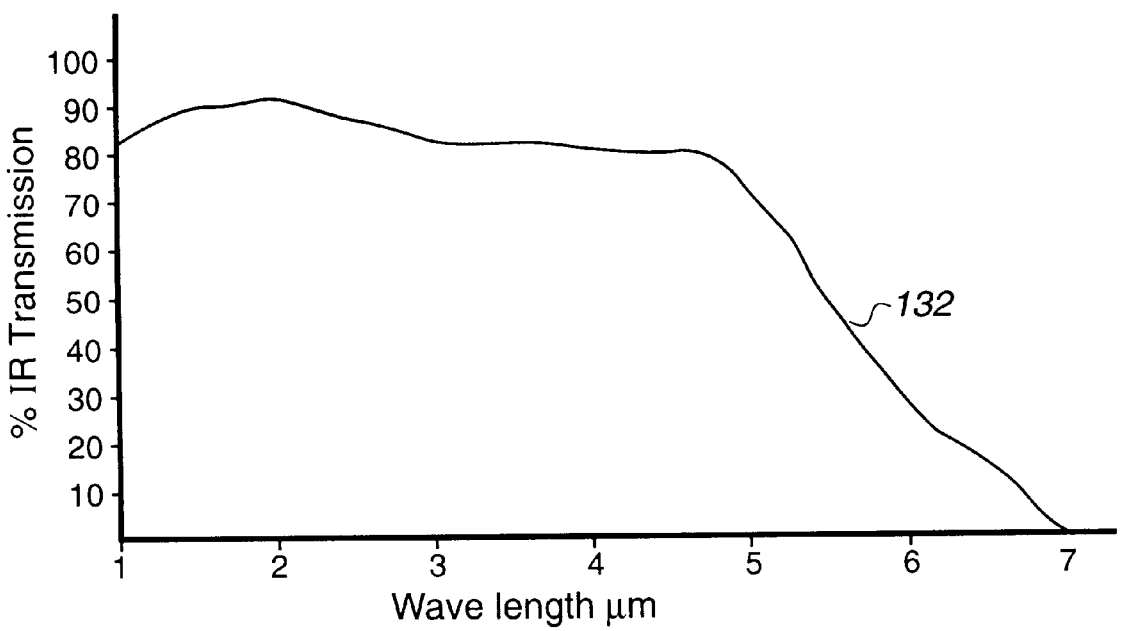
FIG. 2B illustrates a graphical representation of the transmittance of sapphire over a range of wavelengths in accordance with one embodiment of the invention.

FIG. 2B illustrates a graphical representation of the transmittance of sapphire over a range of wavelengths in accordance with one embodiment of the invention. The transmittance of sapphire, represented by line 132, displays sapphire's ability to absorb infrared radiation at wavelengths greater than about 7 microns, while approximately 90% of all incident light is transmitted at wavelengths below 5.5 microns with decreasing amounts of incident light being transmitted between wavelengths of about 5.5 microns and about 7 microns. As mentioned above, since quartz and sapphire both absorb infrared radiation in the spectrum of wavelengths greater than about 5.5 and 7 microns, respectively, the quartz and sapphire undergo heating themselves.

Figure 3A:
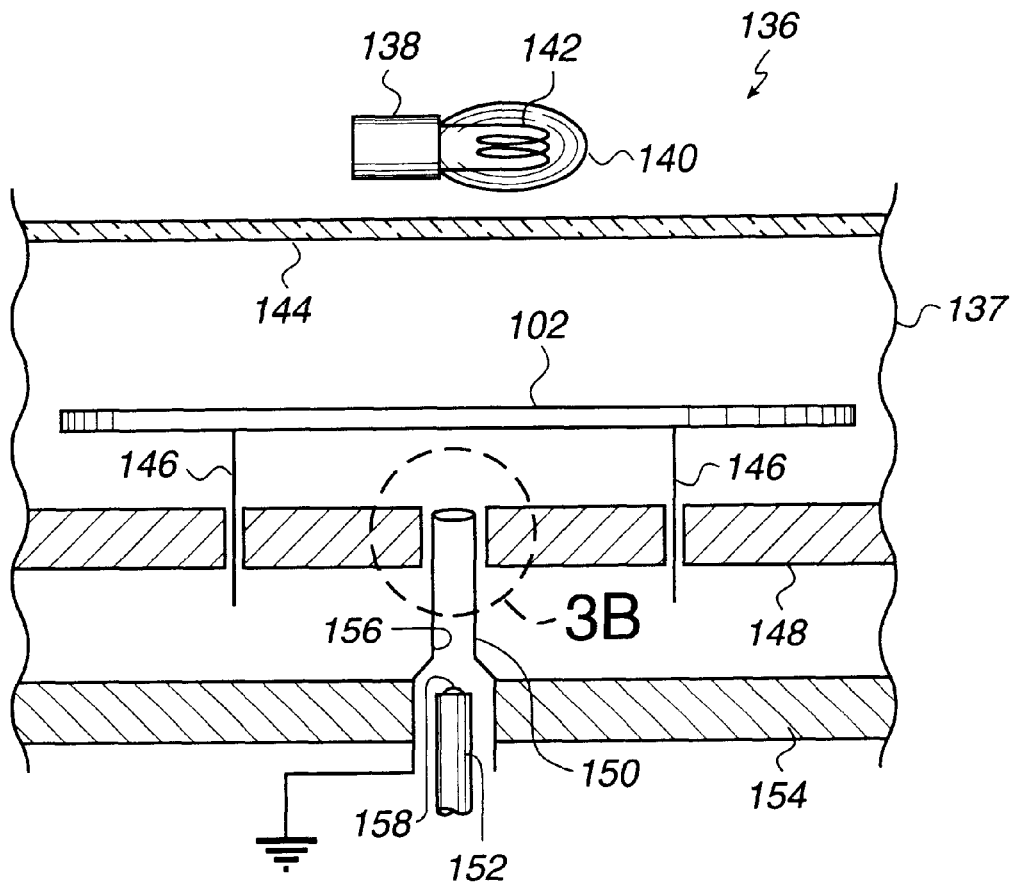
FIG. 3A illustrates a diagram displaying a cross sectional view of a chamber utilizing the non-contact probe for measuring the temperature of a substrate in accordance with one embodiment of the invention.

FIG. 3A illustrates block diagram 136 displaying a cross sectional view of a chamber utilizing the non-contact probe 152 for measuring the temperature of a substrate 102 in accordance with one embodiment of the invention. Chamber 137 includes heating source 138. In one embodiment heating source 138 is a lamp. Heating source 138 includes glass bulb 140 covering filament 142. The use of a single lamp or heating source 138 is shown here for ease of illustration and not meant to be limiting in any way, as multiple lamps or heating sources may be used in another embodiment. Lamp 138 is isolated from the internal processing area of the chamber 137 by the window 144. Where multiple lamps are used, each lamp is isolated from the internal processing area by a window or one window may isolate multiple lamps. In one embodiment of the invention, the window 144 is constructed from one of quartz and sapphire. In another embodiment, the window is cooled to maintain a substantially constant temperature as will be explained in more detail below. The thickness of the window 144 is sufficient to sustain mechanical loads resulting from the higher external pressures, and to maintain the vacuum of the internal processing area in one embodiment. The substrate 102 is sitting on pins 146. The substrate 102 rests on pins 146 for high temperature microwave processing and will rest on platen or chuck 148 during low temperature RF processing as the pins are lowered. It should be appreciated that the view of the platen 148 is a cross sectional view and that the platen is a contiguous piece with apertures for the pins 146 and the sight tube 150. While diagram 136 displays 2 pins 146 to support the substrate 102, of course more than two pins may be used in another embodiment.

Continuing with block diagram 136, sight tube 150 extends through chamber wall 154 into the platen 148. In one embodiment, the sight tube 150 is a non-conductive ceramic material such as aluminum oxide, other ceramic, quartz, sapphire, etc., so that a conduction path is prevented from forming when operating in a radio frequency (RF) mode. In another embodiment, the inside surface of the sight tube 150 has a reflective coating of one of aluminum and titanium. The sight tube 150 is configured to fit into a threaded connection into the chamber wall 154 in one embodiment. Alternatively, the sight tube 150 can be configured to make a seal through an o-ring or a vacuum seal which are well known in the art. Probe body 152 is contained within the sight tube 150. It should be appreciated that the probe body 152 contains a probe which detects the emitted radiant energy from the backside of substrate 102. In one embodiment, the probe body 150 has a sensor window 158 that is transparent to energy emitted in the spectrum between about 8 microns and about 14 microns. A silicon substrate 102 emits energy in this spectrum when it is heated, thus the temperature of the substrate 102 can be measured as a function of the intensity of the energy emitted in this spectrum. In one embodiment, the probe is calibrated to the substrate temperature in the spectrum of about 8 microns to about 14 microns while the temperature of the window 144 remains substantially constant so that the radiant energy emitted by the window is substantially constant and does not interfere with measurement of substrate temperature.

The energy emitted by the lamp 138 in the spectrum between about 8 microns and about 14 microns is absorbed by the quartz or sapphire window. By keeping the temperature of the window substantially constant and calibrating the probe under these conditions, the probe substantially responds only to the intensity of the energy emitted by the substrate. It should be appreciated that the temperature of the glass bulb 140 fluctuates as the lamp 138 is cycled to heat the substrate 102. The glass bulb 140 may contain quartz, thus as the temperature of the bulb 140 fluctuates, the bulb re-emits energy in a broadband spectrum at an intensity dependent on its temperature. However, by maintaining the temperature of the window 144 substantially constant, the window 144 is not affected by the cycling of the glass bulb 140 or the lamp filament 142. Therefore, the probe 152 can be calibrated for the measurement of the substrate temperature to offset a constant amount of background radiation from the window. In one embodiment, the probe can be calibrated to provide accurate temperature readings over a range of substrate temperatures between about 100° C. and about 400° C. using this non-contact technique, without the use of algorithms for compensation or resorting to provision of a light-proof shroud or probe housing.

It should be appreciated that while the temperature of the substrate is approximately 300° C. the environment surrounding the substrate 102 is not at the same temperature as the substrate 102. The substrate 102 is absorbing the radiant energy emitted from the lamp 138, but the gases in the chamber such as oxygen, nitrogen and radicals of oxygen and nitrogen, do not absorb in the infra-red spectrum, therefore, the gases in the chamber may not reach the same temperature as the substrate 102. Additionally, the temperature of the chamber wall is controlled between about 40° C. and about 70° C. in one embodiment.

Figure 3B:
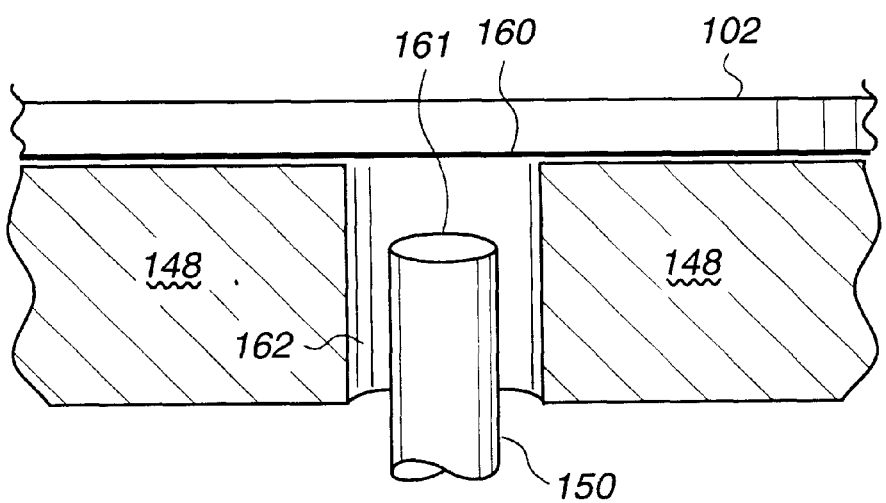
FIG. 3B is an expanded view of the top portion of the probe sight tube in accordance with one embodiment of the invention.

FIG. 3B is an expanded view of the top portion of the sight tube 150 in accordance with one embodiment of the invention. In one embodiment, the distance from the top 161 of the sight tube 150 to the bottom 160 of the substrate 102 is more than twice the diameter of the aperture 162 in the chuck 148. It should be appreciated that the substrate 102 is resting on the chuck 148 in FIG. 3B which is typical of processing in RF mode. However, the non-contact probe 152 is capable of measuring temperature of the substrate 102 while it is either elevated on pins 146 for high temperature microwave processing or lowered on the platen 148 for RF processing.

Figure 4:
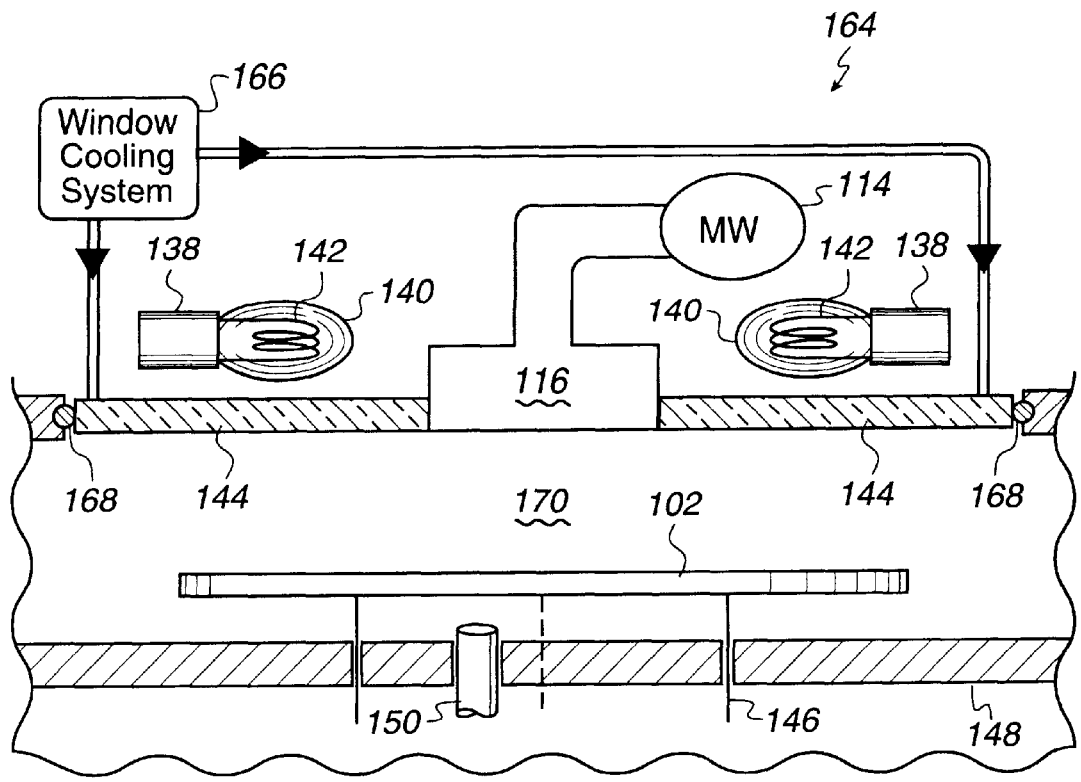
FIG. 4 illustrates block diagram displaying an ashing chamber where filtering windows are maintained at a substantially constant temperature in accordance with one embodiment of the invention.

FIG. 4 illustrates block diagram 164 displaying an ashing chamber where filtering windows 144 are maintained at a substantially constant temperature in accordance with one embodiment of the invention. Windows 144 of block diagram 164 isolate the internal processing chamber 170 from the lamps 138. In one embodiment, seal 168 surrounds each of the windows 144 in order to maintain a pressure or vacuum in the internal processing chamber 170 and seal the windows 144 to the chamber body. In another embodiment the seal 168 is an o-ring of an elastomeric material. Window cooling system 166 is used to maintain the temperature of the windows 144 at a substantially constant temperature.

As mentioned above, the windows 144 are constructed from a material which absorbs energy from the lamps 138 in the spectrum of radiation above a wavelength of about 7 microns and can withstand the conditions of the processing environment. Since the windows 144 absorb the energy, the windows 144 will heat. If the windows are allowed to heat and cool as the filament 142 of the lamp 138 goes on and off or modulates between higher and lower intensities, the window 144 will re-emit varying amounts of energy in the spectrum of radiation above a wavelength of about 7 microns, which will interfere with the temperature measurement. Therefore, the cooling system 166 maintains the window 144 at a substantially constant temperature to eliminate any interference from radiant energy re-emitted by the windows 144. In one embodiment the temperature of the windows is maintained substantially constant at about 20° C. By maintaining a constant window temperature, one is able to compensate for the background re-emission of energy from the windows while calibrating the probe 152.

It should be appreciated that in one embodiment, the quartz bulb 140 covering the radiating filament 142 of the heating lamp 138 substantially filters radiation in the spectrum of wavelengths above 5.5 microns. This causes the quartz bulb temperature to fluctuate as the lamp filaments 142 turn on and off or modulate as per the requirements of a controller in communication with the lamps 138. Since all direct radiation in the spectrum of wavelengths above 5.5 microns is filtered by the glass bulb 140, no radiation in this spectrum from the filament 142 is directly incident on the window 144. All energy in the spectrum of wavelengths above 5.5 microns is absorbed by the quartz bulb 140 which causes the above mentioned temperature fluctuation. The quartz bulb re-emits this absorbed radiation in a broadband of wavelengths. It should be further appreciated, that the fraction of energy in the spectrum above about 7 microns that the quartz bulb 140 now re-emits is absorbed by the window 144. However, the small magnitude of this energy is more adequately compensated for by provision of a well-designed cooling system 166 for the window 144.

The cooling system 166 of FIG. 4 is any type of cooling system capable of maintaining the window 144 at a substantially constant temperature. For example, the cooling system 166 can be one of a fan-driven forced air type cooling system, a liquid heat exchanging system, or forced nitrogen flow. In addition, the cooling system 166 also provides cooling to the seal 168 in order to maintain integrity of the seal in one embodiment. It should be appreciated that the cooling system 166 will absorb the heat energy which the windows 144 absorbs from the lamps 138, so that the windows 144 maintain a substantially constant temperature. By maintaining the substantially constant temperature, the probe 152 can be calibrated to offset the effect of any energy emitted by the windows 144. It should be appreciated that the windows 144 act as a filter by absorbing the light energy in the spectrum above about 7 microns. Furthermore, since the windows 144 filter the radiant heat energy in the spectrum above about 7 microns, it is unnecessary to make the sight tube 150 light proof. That is, the high intensity of broad-band radiation emanating from the lamps 138 does not affect the temperature measuring device because of the filtering performed first by the quartz bulb 140 and then by the windows 144. Thus the need to protect the probe 152 from light leakage is eliminated. As mentioned previously, any number of windows 144 and lamps 138 may be used and the examples provided herein are not meant to limit the invention to a set number of windows 144 and lamps 138.

Figure 5A:
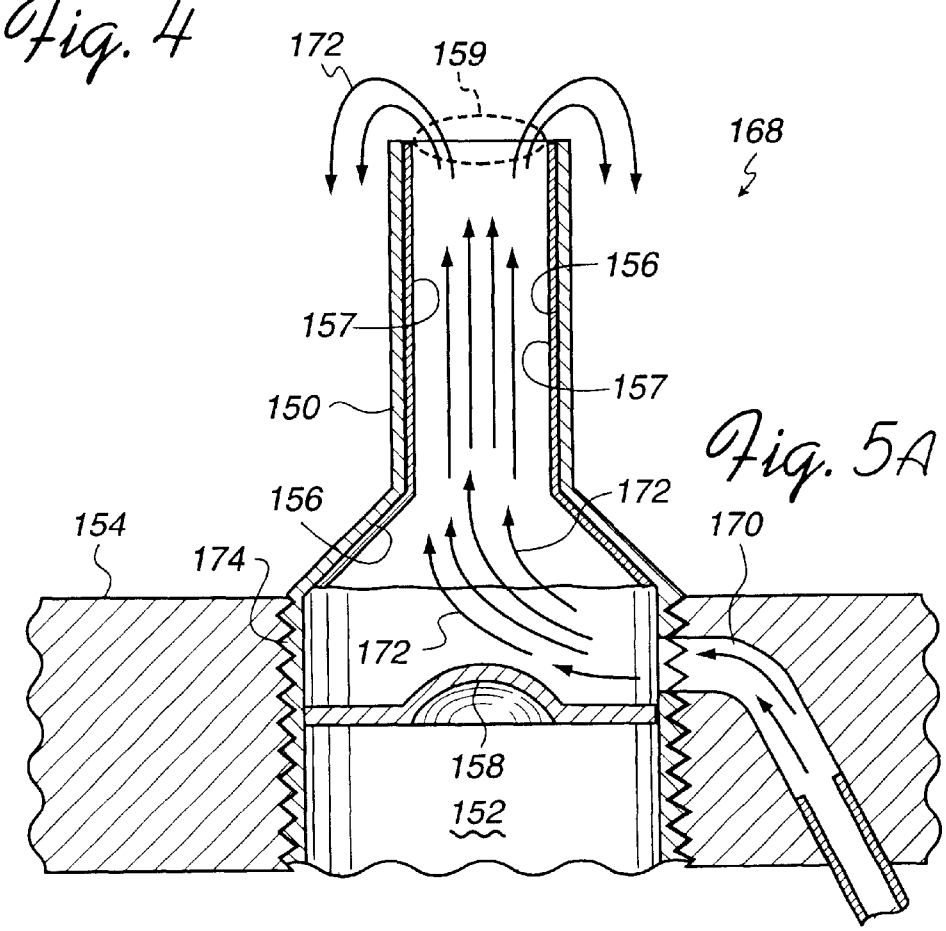
FIG. 5A illustrates a diagram displaying a detailed view of the sight tube and probe in accordance with one embodiment of the invention.

FIG. 5A illustrates diagram 168 displaying a detailed view of the sight tube 150 and probe 152 in accordance with one embodiment of the invention. As mentioned above, the body of sight tube 150 is an electrically non-conductive material. In a preferred embodiment the non-conductive material is a ceramic like aluminum oxide, quartz, sapphire, etc. The inner surface 156 of sight tube 150 is coated with a reflective material in order for the radiant energy to reach the sensor window 158 and not be absorbed by the sight tube 150. One skilled in the art would appreciate that a non-reflective coating would prevent a substantial portion of the energy emitted by the substrate 102 from reaching the sensor window 158, thereby causing an inaccurate temperature reading. In one embodiment, the reflective coating 157 on the inner surface 156 is one of aluminum, titanium, or stainless steel.

Figure 5B:
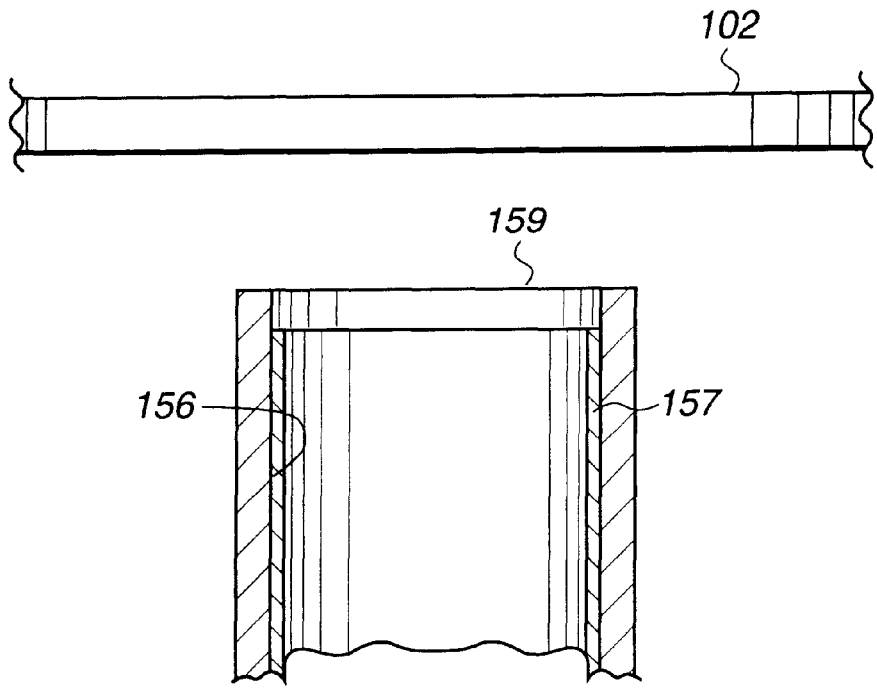
FIG. 5B is a detailed view of the sight tube end depicting a reflective metal coating on the inner surface of the tube in accordance with one embodiment of the invention.

FIG. 5B is a detailed view of the sight tube 150 end depicting a reflective metal coating 157 on the inner surface 156 of the tube 150 in accordance with one embodiment of the invention. As illustrated in FIG. 5B, the reflective coating 157 ends at a safe distance from the substrate 102 to prevent arcing between the metal and the substrate 102. In one embodiment, the reflective coating 157 ends at a distance prior to the top 159 of the sight tube 150 so as to prevent the arcing mentioned above. One skilled in the art of designing such a device would ensure that the reflective lining is electrically uncoupled from the platen electrode 120 and from the grounded chamber wall 126. Provision of a non-conducting ceramic body to separate the lining from both electrode and chamber wall permits its potential to float thereby preventing current flow and heating of the lining material. It should be appreciated that the lining material must sustain a substantially constant temperature to prevent interference with the measurement.

Returning to FIG. 5A, the sensor window 158 is constructed from a material transparent to the light energy in the wavelength range between about 8 microns and about 14 microns in one embodiment. It should be appreciated that energy emitted by the substrate 102 at wavelengths between about 8 and about 14 microns is used to infer substrate temperature. Therefore, the sensor window 158 must be transparent at these wavelengths of emitted energy from the substrate 102. In a preferred embodiment, the sensor window is made from one of calcium fluoride (CaF$_2$) and Germanium. In order to protect the sensor window 158 from being etched by the stripping chemicals, such as fluorine and oxygen, a bleed gas port 170 is included. The bleed gas port 170 allows an inert gas to continuously flow over the sensor window 158 and through the sight tube 150 in order to provide a shield against the stripping chemicals. Bleed gas port 170 is located outside the chamber wall 154. In one embodiment the inert gas is one of helium, nitrogen, argon, etc. In another embodiment, the flow rate of the inert gas is up to 10 standard cubic centimeters per minute (sccm) in order to maintain a positive pressure compared to outside the sight tube 150. The positive pressure prevents the process chemicals from entering the sight tube 150. The path of the inert gas is depicted by arrows 172. In one embodiment, the inert gas is used only when the substrate is on the pins 146, i.e., for microwave processing.

Continuing with FIG. 5A, sensor window 158 is attached to probe body 152. Probe body 152 is inserted into sight tube 150. In one embodiment, probe body 152 is inserted through threaded connections 174. In another embodiment the probe body 152 can be installed in the sight tube 150 through an o-ring seal or a compression fitting. As demonstrated by FIG. 5A, the sensor window 158 and probe body 152 are located outside of the chamber wall 154, thus allowing for easy access to the sensor window 158 and the probe body 152. Additionally, there is no contact between the sensor window 158 or the probe and the substrate 102, thereby eliminating all of the disadvantages of having the sensor contact the substrate 102. As mentioned above the need to light-proof the sight tube 150 is eliminated due to the filtering capability of the windows 144.

Figure 6:
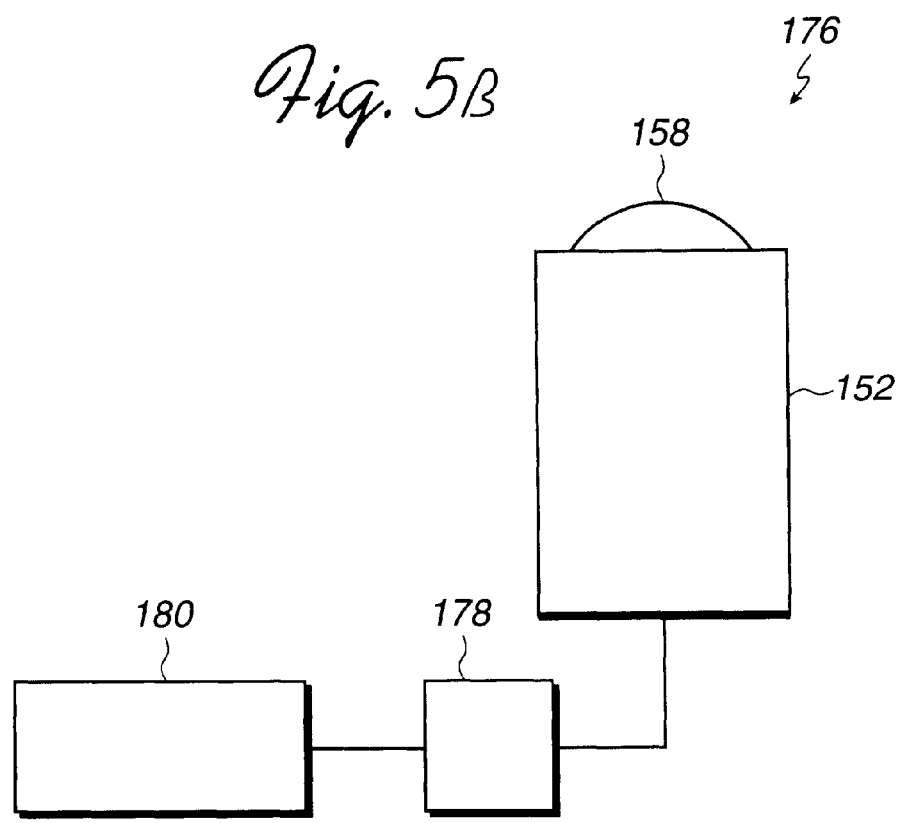
FIG. 6 illustrates a diagram displaying a probe configuration that can be adjusted on-line for different substrate backside emissivities in accordance with one embodiment of the invention.

FIG. 6 illustrates diagram 176 displaying a probe configuration that can be adjusted on-line for different substrate backside emissivities in accordance with one embodiment of the invention. The probe body 152 includes a signal conditioner 178. The signal conditioner 178 is configured to amplify the raw electrical signal from the probe 152 through a signal amplification factor. In one embodiment the signal conditioner includes the application electronics for the probe. The signal amplification factor is internally used to amplify or attenuate the signal that the probe detects, which is dependent on the emissivity of the surface that the probe is monitoring i.e., the backside of the substrate. For example, if the probe is monitoring a black body, which is a perfect absorber and efficiently re-emits radiant energy, the probe signal will have to be attenuated through the signal amplification factor. On the other hand, if the probe is monitoring a reflective and transmissive surface, that is one with a low emissivity, the probe signal must then be amplified.

The capability to adjust the signal from the probe is a useful tool since substrates can have different backsides. For example, substrates can include backsides of silicon nitride, silicon dioxide, silicon carbide, etc. It should be appreciated that the different materials of construction of the backside layers on the substrate have different optical characteristics. With the capability to calibrate the probe for an optical characteristic of a particular type of material, the probe of probe body 152 can be e compensated in situ for the type of substrate being used in accordance with one embodiment.

As substrates typically come in lots, the probe can be calibrated for a certain lot of substrates. Thus, the probe contained in probe body 152 can be fine-tuned to the characteristics of the substrate, which is difficult for temperature measurements using a contact pad.

Controller 180 of FIG. 6 is in communication with signal conditioner 178. In one embodiment, the controller 180 sends a signal to adjust the signal conditioner 178 depending on the type of substrate being looked at by the probe. For example, if the backside of the substrate is silicon nitride, then the controller 180 sends a signal to the signal conditioner to adjust the amplification suitable for the optical characteristics of silicon nitride. It should be appreciated that since the probe is actually looking at the backside of the substrate where the characteristics are well defined, a much more accurate reading is obtained than when looking at an aluminum pad where the characteristics are not well defined.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for measuring and maintaining a temperature of a substrate in a processing chamber, the processing chamber comprising:
   a heating source being controlled by a controller, the heating source emitting energy for heating the substrate;
   an optical window maintained at a substantially constant temperature, the window configured to allow a first wavelength spectrum of energy emitted from the heating source to pass through the window while absorbing a second wavelength spectrum of energy from the heating source, the window isolating the heating source from an internal region of the processing chamber; and
   a probe, the probe configured to detect the second wavelength spectrum of energy emitted directly from the substrate as a result of the first wavelength spectrum of energy heating the substrate, the second wavelength spectrum of energy corresponding to a temperature of the substrate, the temperature of the substrate provided to the controller, wherein the controller adjusts an intensity of the heating source based on a set point temperature for the substrate.

2. The apparatus as recited in claim 1, wherein the heating source is a lamp.

3. The apparatus as recited in claim 1, wherein the first wavelength spectrum is between about 1 micron and about 7 microns and the second wavelength spectrum is between about 8 microns and about 14 microns.

4. The apparatus as recited in claim 1, wherein the window is constructed from one of quartz and sapphire.

5. The apparatus as recited in claim 1, wherein the probe is remotely located from the substrate.

6. The apparatus as recited in claim 1, wherein the inner surface of the probe is coated with a reflective material.

7. The apparatus as recited in claim 1, further including:
   a sight tube, the sight tube configured to protect the probe from the processing environment of the chamber.

8. The apparatus as recited in claim 1, wherein the sight tube includes a gas bleed, the gas bleed allowing a gas to flow through the sight tube, the gas flow creating a positive pressure in the sight tube so as to keep process chemicals in the processing chamber from diffusing into the probe.

9. A temperature controlling system for controlling the temperature of a substrate in a chamber, the system comprising:
   a heating source;
   a window, the window being transparent to a first spectrum of wavelengths of energy from the heating source while being opaque to a second spectrum of wavelengths of energy from the heating source;
   a cooling system, the cooling system maintaining the window at a substantially constant temperature as the window absorbs the second spectrum of wavelengths of energy from the heating source; and
   a probe, the probe located remotely from the substrate, the probe configured to detect the second spectrum of wavelengths of energy emitted directly from the substrate as a result of the first wavelength spectrum of energy heating the substrate, wherein the second spectrum of wavelengths of energy emitted from the substrate correlates to a temperature of the substrate, the temperature of the substrate communicated to a controller of the heating source, the controller of the heating source controlling an intensity of the heating source based upon the temperature of the substrate.

10. The temperature controlling system as recited in claim 9, wherein the heating source emits infrared radiation.

11. The temperature controlling system as recited in claim 10, wherein the first spectrum of wavelengths is between about 1 micron and about 7 microns and the second spectrum of wavelengths is between about 8 microns and 14 microns.

12. The temperature controlling system as recited in claim 9, further including:
   a sight tube, the sight tube configured to protect the probe from the processing environment of the chamber.

13. The temperature controlling system as recited in claim 12, wherein the sight tube is constructed from a non-conductive material.

14. The temperature controlling system as recited in claim 13, wherein an inner surface of the sight tube is coated with a reflective material.

15. The temperature controlling system as recited in claim 9, further including:
   a signal conditioner, the signal conditioner configured to adjust a signal from the probe.

16. The temperature controlling system as recited in claim 9, wherein the probe allows for the calibration of the optical characteristics of a particular type of material.

17. A method for measuring and maintaining a temperature of a substrate in a processing chamber, the method comprising:
   providing energy from a heating source;
   heating the substrate with a first wavelength spectrum of the energy from the heating source;
   filtering a second wavelength spectrum of the energy from the heating source prior to the second wavelength entering an internal region of the processing chamber, the second wavelength spectrum of energy being greater than 7 microns;
   detecting energy emitted by the substrate, the detecting performed by a non-contact probe, the energy emitted by the substrate having the second wavelength spectrum; and
   adjusting an intensity of the heating source based upon the detected energy emitted by the substrate.

18. The method as recited in claim 17, wherein the energy is infrared radiation.

19. The method as recited in claim 17, wherein the first wavelength spectrum is between about 1 micron and about 7 microns and the second wavelength spectrum is between about 8 microns and about 14 microns.

20. The method as recited in claim 17, wherein the filtering is accomplished by a window constructed from one of quartz and sapphire, the window maintained at a constant temperature.

21. The method as recited in claim 17, wherein the detecting energy emitted by the substrate further includes:
   calibrating the probe according to the optical characteristics of the substrate.

22. A method for measuring a temperature of a body in a chamber, the chamber being configured to introduce heat energy through a window, wherein the window is transparent to a first wavelength spectrum of the heat energy and opaque to a second wave length spectrum of the heat energy, the method comprising:
   providing a heat source, the heat source emitting the heat energy through the window into the chamber;
   providing a cooling system for maintaining the window at a substantially constant temperature;
   heating the body with the first wavelength spectrum of the heat energy; and
   detecting the temperature of the body from emissions resulting from the first wavelength, the detecting including;
      providing a probe, the probe remotely located from the body and configured to detect an intensity of the body's emissions of the second wavelength spectrum; and
      translating the detected intensity to the temperature of the body.

23. The method as recited in claim 22, wherein the heat energy is infrared radiation.

24. The method as recited in claim 23, wherein the spectrum of the first wavelength spectrum is between about 1 micron and 7 microns and the second wavelength spectrum is between about 8 microns and about 14 microns.

25. The method as recited in claim 22, wherein detecting the temperature of the body further includes:
   protecting the probe from an environment of the chamber; and
   calibrating the probe for the body's optical characteristics.

26. The method as recited in claim 22, further including:
   communicating the temperature of the body to a controller, the controller adjusting the intensity of the heat source in response to the temperature of the body.

27. The method as recited in claim 22, wherein the heat source is a lamp.

28. The method as recited in claim 25, wherein the body is a semiconductor substrate.

* * * * *